United States Patent
Gefter

(10) Patent No.: US 9,859,090 B2
(45) Date of Patent: Jan. 2, 2018

(54) SELF-CLEANING LINEAR IONIZING BAR AND METHODS THEREFOR

(71) Applicant: ILLINOIS TOOL WORKS INC., Glenview, IL (US)

(72) Inventor: Peter Gefter, S. San Francisco, CA (US)

(73) Assignee: Illinois Tool Works Inc., Glenview, IL (US)

(*) Notice: Subject to any disclaimer, the term of this patent is extended or adjusted under 35 U.S.C. 154(b) by 16 days.

(21) Appl. No.: 14/965,374

(22) Filed: Dec. 10, 2015

(65) Prior Publication Data

US 2017/0169986 A1 Jun. 15, 2017

(51) Int. Cl.
| | | |
|---|---|---|
| *H01T 23/00* | (2006.01) | |
| *B03C 3/41* | (2006.01) | |
| *H01J 37/02* | (2006.01) | |
| *H01T 19/00* | (2006.01) | |
| *H01J 37/30* | (2006.01) | |

(52) U.S. Cl.
CPC ........ *H01J 37/026* (2013.01); *H01J 37/3002* (2013.01); *H01T 19/00* (2013.01); *H01J 2237/0041* (2013.01)

(58) Field of Classification Search
CPC ............ H01T 23/00; B03C 3/41; F24F 3/166
USPC ........................................................ 361/230
See application file for complete search history.

(56) References Cited

U.S. PATENT DOCUMENTS

| 4,442,356 A | 4/1984 | Ludwick et al. ............. 250/324 |
| 7,057,130 B2 | 6/2006 | Gefter et al. ............ 219/121.36 |
| 7,408,759 B2 * | 8/2008 | Gefter ..................... H01T 23/00 |
| | | 361/230 |

(Continued)

FOREIGN PATENT DOCUMENTS

| EP | 1213949 | 6/2002 | ............. H01T 23/00 |
| GB | 1305382 | 1/1973 | ............... A61N 1/44 |
| WO | WO 03/100932 | 12/2003 | |
| WO | WO 2013021378 | 2/2013 | ............. H01T 23/00 |

OTHER PUBLICATIONS

Int'l Search Report and Written Opinion for PCT/US2016/059883 dated Jan. 27, 2017 (12 pages).

(Continued)

*Primary Examiner* — Dharti Patel
(74) *Attorney, Agent, or Firm* — McAndrews, Held & Malloy, Ltd.

(57) ABSTRACT

A self-cleaning linear ionizer with at least one ionizing electrode, at least one electrode-cleaner, and at least two spool assemblies is disclosed. The electrode has opposing ends and defines an axial working length with a surface that produces an ion cloud and develops degradation products with use. Although the working length of the electrode is stationary, the electrode is movable. The electrode-cleaner is also stationary and selectively engages the electrode along its working length. The opposing ends of the electrode are fixed to the opposing spool assemblies which selectively move the ionizing electrode such that the electrode-cleaner removes at least some of the surface degradation products from the electrode during movement. Methods of using the disclosed ionizer have self-cleaning and ionization modes of operation, which may occur cyclically, alternately, or simultaneously, are also disclosed.

24 Claims, 8 Drawing Sheets

(56) References Cited

U.S. PATENT DOCUMENTS

| | | | |
|---|---|---|---|
| 7,679,026 B1 | 3/2010 | Gefter et al. | 219/121.52 |
| 7,821,762 B2 | 10/2010 | Yasuoka et al. | 361/212 |
| 7,822,355 B2 | 10/2010 | Schlitz | 399/100 |
| 8,038,775 B2 | 10/2011 | Gefter | 96/63 |
| 8,174,814 B2 | 5/2012 | Yasuoka et al. | 361/230 |
| 8,492,733 B1 * | 7/2013 | Klochkov | H01T 19/00 250/324 |
| 8,710,456 B2 | 4/2014 | Klochkov et al. | 250/453 |
| 2006/0200921 A1 | 9/2006 | Shih et al. | 15/21.1 |
| 2007/0235661 A1 | 10/2007 | Gefter et al. | 250/424 |
| 2008/0199208 A1 | 8/2008 | Schlitz | 399/100 |
| 2012/0224293 A1 | 9/2012 | Partridge et al. | 361/230 |

OTHER PUBLICATIONS

John Evans' Sons Constant Force Springs product information, author unknown, date unknown—admitted prior art, 9 pages total.
Webpage from Lee Spring website, two sheets, date unknown (admitted prior art), available online at http://www.leespring.com/int_learn_constant_force_springs.asp.
Webpage from Lee Spring website, one sheet, date unknown. (admitted prior art), available online at http://www.leespring.com/int_learn_constant_force_springs_2500.asp.
Webpage from Lee Spring website, one sheet, date unknown (admitted prior art), available online at http://www.leespring.com/int_learn_constant_force_springs_4000.asp.
Webpage from Lee Spring website, one sheet, date unknown (admitted prior art), available online at http://www.leespring.com/int_learn_constant_force_springs_13000.asp.
Webpage from Lee Spring website, one sheet, date unknown (admitted prior art), available online at http://www.leespring.com/int_learn_constant_force_springs_25000.asp.
Webpages from LIROS website, ten sheets, date unknown, available online at http://www.liroselectronic.com.
Simco-Ion Datasheet DS-5710_V2 for uWire Aerobar Model 5710, two pages, author unknown, dated Jul. 2012.
Simco-Ion Datasheet, DS-5822i_V8 for Ionizing Blower Model 5822i, two pages, author unknown, dated Mar. 2014.
Simco-Ion Datasheet, DS-6202e_V6 for Ionizing Blower Model 6202e, two pages, author unknown, dated May 2011.
Simco-Ion Datasheet, DS-6422e_V9 for Ionizing Blower Model 6422e, two pages, author unknown, dated Jan. 2013.
Simco-Ion Datasheet, DS-6432_V10 for Ionizing Blower Model 6432, two pages, author unknown, dated Jan. 2013.
Simco-Ion Datasheet, DS-minION_V1-1 for Compact Ionizing Blower Model minION2, two pages, author unknown, dated May 2012.
PCT Application PCT/US2012/033278, Notification of . . . , International Search Report and Written Opinion of the International Searching Authority, dated Sep. 14, 2012; 13 pages total.

* cited by examiner

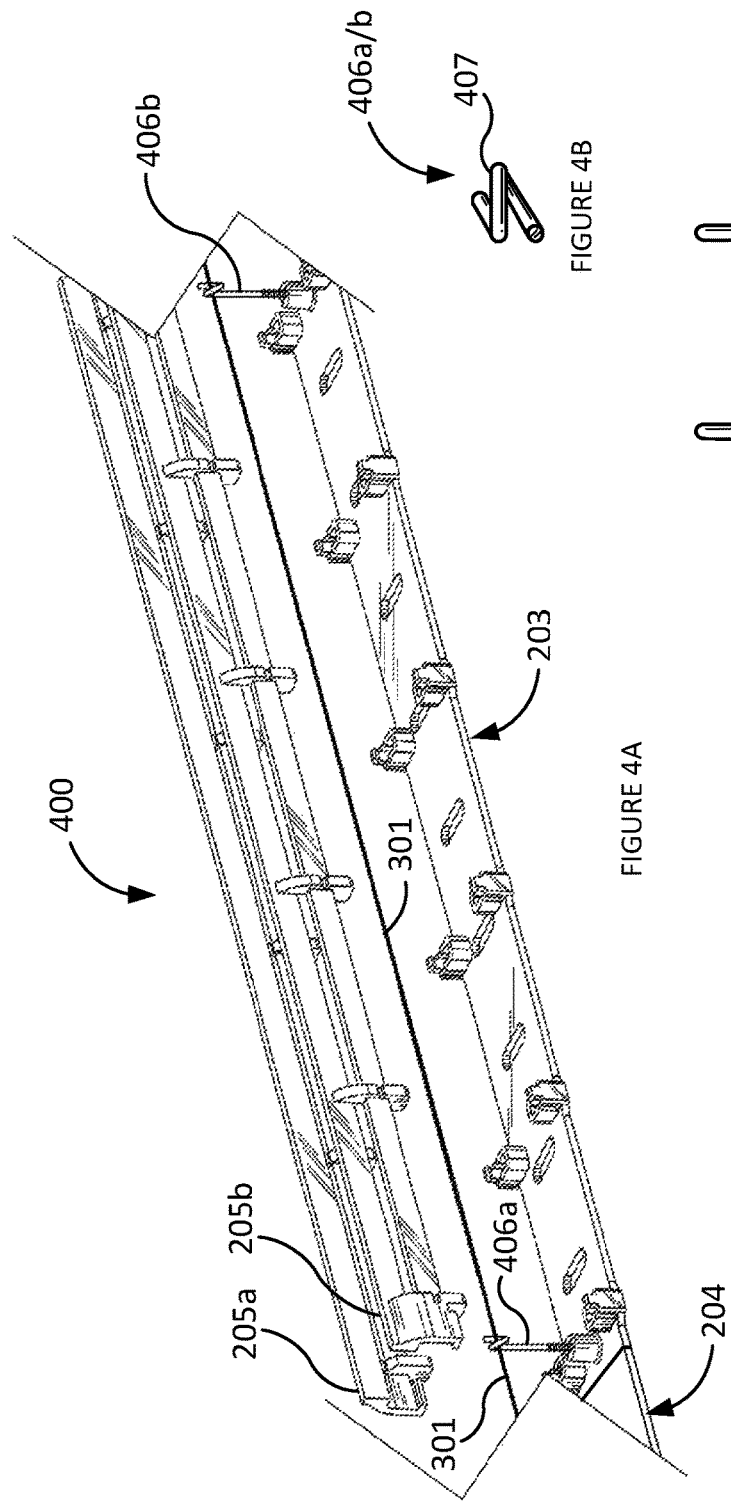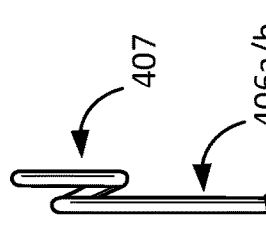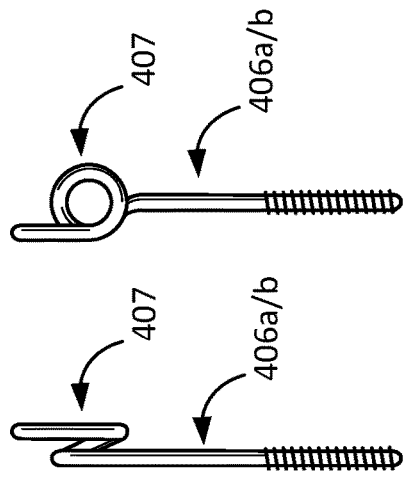
FIGURE 4A
FIGURE 4B
FIGURE 4C
FIGURE 4D

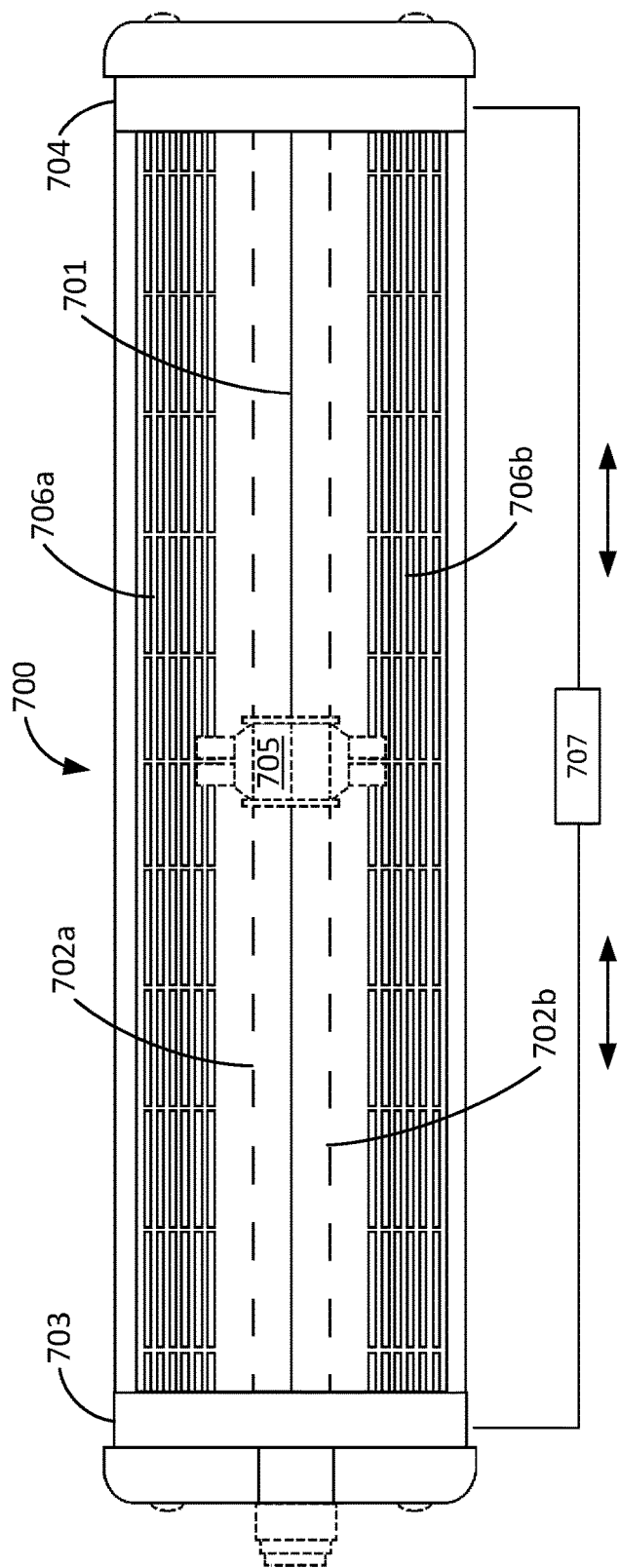
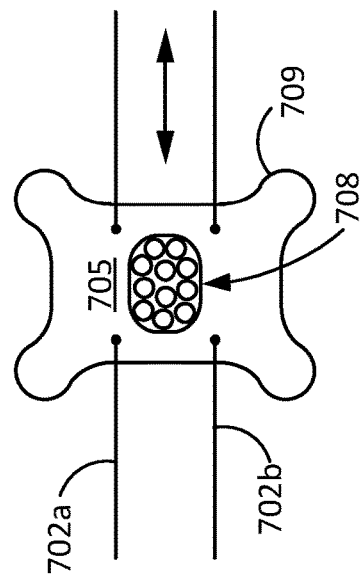
FIGURE 7A
FIGURE 7B

SELF-CLEANING LINEAR IONIZING BAR AND METHODS THEREFOR

BACKGROUND OF THE INVENTION

1. Field of the Invention

The present invention is directed to self-cleaning linear ionizers and related processes for corona ionizers. The invention is particularly useful in (but not limited to) ionizing bars in which the linear ion emitter is a wire. Accordingly, the general objects of the invention are to provide novel systems, methods and apparatus of such character.

2. Description of the Related Art

Conventional linear ionizing bars are typically composed of: (1) a bar type ionization cell having at least one linear emitter and one or more non-ionizing reference electrode(s); (2) a clean air (or other gas) supply system having a group of jet type nozzles surrounding each ion emitter and connected to a supply manifold; and (3) a control system with an AC or pulsed DC high voltage power supply connected to the ionization cell. Such linear ionizing bars have found applications in a wide variety of manufacturing industries including flat panel displays, general electronics, semiconductors, etc. While some designs/applications may be optimized for ionization/charging, others may, instead, be optimized for charge neutralization. Charge neutralization applications may entail neutralization of large charged objects at relatively close distances and at rapid throughput rates. For example, the front and back of glass panels having a length and a width exceeding 3000 mm may need to be charge-neutralized wherein the distance between an ionizing bar(s) and the display panels usually ranges from 50-100 mm up to 1000 mm or more, and wherein the display panels are transported at high speeds using robotics systems.

Charge neutralizing bars with linear ionizers (ionizing cells comprising long thin wire(s) as emitter(s)/electrode(s)) have been suggested in (1) U.S. Pat. No. 7,339,778, entitled "Corona Discharge Neutralizing Apparatus"; (2) U.S. Pat. No. 8,048,200, entitled "Clean Corona Gas Ionization For Static Charge Neutralization"; and (3) U.S. Pat. No. 8,492,733 entitled "Multi-Sectional Linear Ionizing Bar And Ionization Cell", all of which patents are hereby incorporated by reference in their entirety. Further, ionizing bars with wire emitters are currently produced by AB Liros Electronic of Malmö, Sweden and/or Liros Electronic of Hamburg, Germany, and Simco-Ion Technology Group of Alameda, Calif. USA.

With joint reference to FIGS. 1 and 2, a conventional multi-sectional linear ionizing bar 100 comprises four primary elements: a housing/enclosure 103, two ionization cells 101 and 102 with a stationary linear ion emitter 201 for establishing an ion plasma region along the length thereof, a manifold (hidden from view within housing 103) for receiving gas from a source and for delivering same past linear ion emitter 201, and means for applying 202 an ionizing signal/voltage (from a conventional/suitable power supply) to linear ion emitter 201 to thereby establish the ion plasma region. The ionization cells 101,102 also have common reference (non-ionizing) electrodes 104 and 105 positioned on both sides of the ion emitter 201. The electrodes 104,105 are conventionally positioned parallel to, on opposite sides of, and equally distant from ion emitter 201 This particular linear ionizing bar is shown and described in detail in U.S. Pat. No. 8,492,733 entitled "Multi-Sectional Linear Ionizing Bar And Ionization Cell" (incorporated by reference above).

As shown in FIGS. 1 and 2, housing 103 supports detachable ionization cell modules 101 and 102 from one side such that daisy-chaining of multiple cells together is easily accomplished. Enclosure 103 may house a high voltage power supply and control system within an interior side (bidden from view by the enclosure 103).

Each conventional ionization cell 101 and 102 may comprise a linear, for example, wire type corona discharge ion emitter/electrode 201, a pair of grills 205a and 205b, and an array (multiplicity/plurality) of gas orifices 206 positioned behind linear ion emitter 201 and through plate 203 for delivering gas steams past linear ion emitter 201 as shown.

It will be appreciated that the contact/tensioning springs 202 are preferably positioned at and affixed to each end of wire electrode 201 and to stationary cell 103. Springs 202 also receive high voltage ionizing signals and apply them to electrode 201. When such AC ionizing signals (typically, high voltage AC, but DC in certain applications) is applied to linear electrode 201, corona discharge occurs (between the electrodes 201 and 104,105) to thereby yield copious amounts of both polarity ions. As a result, emitter 201 is surrounded by dense, high-concentration bipolar ion cloud of positive and negative ions.

Despite the advantages of conventional linear ionizing bars of the type discussed above, they still suffer from at least one deficiency common among corona discharge ionizers: emitter corrosion/contamination/degradation which may significantly reduce ionizing bar performance by causing an undesirable ion balance offset, longer discharge times, and the spread of contamination to the ambient environment and the target workpiece(s). Therefore, manual and regular emitter cleaning is a mandatory maintenance requirement for linear ionizing bars of the type discussed above. In this design, wire emitter is elevated above base plate 203 by the spring arrangement to facilitate manual removal of corrosion, debris, dust, etc. that accumulates on wire electrode 201.

Manual cleaning is undesirable for a number of reasons. For example, the manual cleaning process requires turning off the flow of air/gas and the high voltage ionizing signals and inserting some type of wire cleaning implement between two grills/rails 205a and 205b. This cleaning implement may be a brush, a wet/dry wipe, or a foam block that physically contacts emitter wire 201 as it is rubbed back and forth along emitter 201. The cleaning implement may be connected to a stick to reach emitter wire 201 from a relatively long distance because it is often difficult to reach the ion emitter wire for manual cleaning especially for ionizing bars installed in large semiconductor tools. For this reason, manual cleaning may damage the wires, spring contacts, and shorten lifetime of the detachable ionization cells. Last but not least, the frequency with which cleaning cycles must occur depends on the ambient air conditions/cleanness (such as airborne particulate concentration or airborne molecular contamination (AMC)) of rooms/production floors in which the ionizing bars are used. Such cleaning cycles may be time-consuming and may be required daily or weekly in certain critical field-applications.

SUMMARY OF THE INVENTION

The currently disclosed invention suggests new approaches for linear ionizer designs that are capable of solving the above-mentioned problems and, thus, are naturally beneficial for FPD industrial, semiconductor, and other applications.

In one apparatus form, the present invention satisfies the above-stated needs and overcomes the above-stated and other deficiencies of the related art by providing a self-cleaning linear ionizer having at least one ionizing electrode with opposing ends, at least one electrode-cleaner, and at least two spool assemblies. The electrode defines an axial working length that establishes a linear ion cloud when an ionizing voltage is applied thereto and a surface that develops degradation products with use. Such degradation products may (or may not) be due to the accumulation of contaminant byproducts as a result of interaction between the electrode surface and the ambient environment during corona discharge. For example, degradation products may be due to wire erosion/corrosion rather than any attraction of undesirable particles. As used herein the working length of the electrode is the linear portion of the electrode that discharges charge carriers in response to the application of an ionizing voltage, whether or not the electrode is moving. Although the working length of the electrode is stationary, the electrode may be axially movable along the stationary and linear working length. The electrode-cleaner may selectively engage the electrode along its working length and, optionally, may be stationary, or vibrate. The opposing ends of the electrode may be fixed to the opposing spool assemblies which selectively move the ionizing electrode such that the electrode-cleaner removes at least some of the surface degradation products from the electrode during movement. A constant-force spring motor tensions the electrode such that a substantially constant tensional force is maintained on the electrode.

One method form of the invention may comprise a method of using an ionizer of the type having a movable ionizing electrode with opposing ends and a linear and axis-defining working length that is equal to or less than the length of the electrode, a stationary or movable electrode-cleaner that may selectively engage the electrode, opposing spool assemblies to which the electrode ends are affixed such that the linear working length of electrode is disposed between the opposing spool assemblies, and a constant force spring assembly tensioning the electrode on the opposing spool assemblies such that a substantially constant tensional force is maintained on the electrode. One step of the inventive methods of using may comprise applying an ionizing signal to the electrode, during an ionization/working mode of operation, to thereby establish a linear ion cloud along the linear working length thereof whereby the electrode surface develops degradation products with use. Another step of the inventive methods of using may comprise rotating the spool assemblies, during a cleaning mode of operation, to move and tension the ionizing electrode in a first axial direction such that the electrode-cleaner removes surface degradation products from the electrode during movement.

In various alternative method embodiments the ionization and cleaning modes of operation may occur simultaneously, alternately, and/or selectively repeated in desired patterns/cycles. For example, the cleaning mode of operation may be repeated at least twice in a row before each time the ionization mode of operation is repeated.

Naturally, the above-described methods of the invention are particularly well adapted for use with the above-described apparatus of the invention. Similarly, the apparatus of the invention are well suited to perform the inventive methods described above.

Numerous other advantages and features of the present invention will become apparent to those of ordinary skill in the art from the following detailed description of the preferred embodiments, from the claims and from the accompanying drawings.

BRIEF DESCRIPTION OF THE DRAWINGS

The preferred embodiments of the present invention will be described below with reference to the accompanying drawings where like numerals represent like steps and/or structures and wherein:

FIG. 4A is a partial and exploded perspective view of a physical implementation of the embodiment of the invention schematically presented in FIG. 3;

FIGS. 4B, 4C and 4D show one particularly preferred pigtail support element for use in the embodiment of the invention presented in FIGS. 3 and 4A;

FIG. 7A is an bottom view of a second preferred embodiment of the self-cleaning linear ionizer of the invention, which embodiment employs a cleaning shuttle; and FIG. 7B shows the cleaning shuttle of the second preferred embodiment of FIG. 7A in greater detail.

DETAILED DESCRIPTION OF THE PREFERRED EMBODIMENTS

Figure 3:
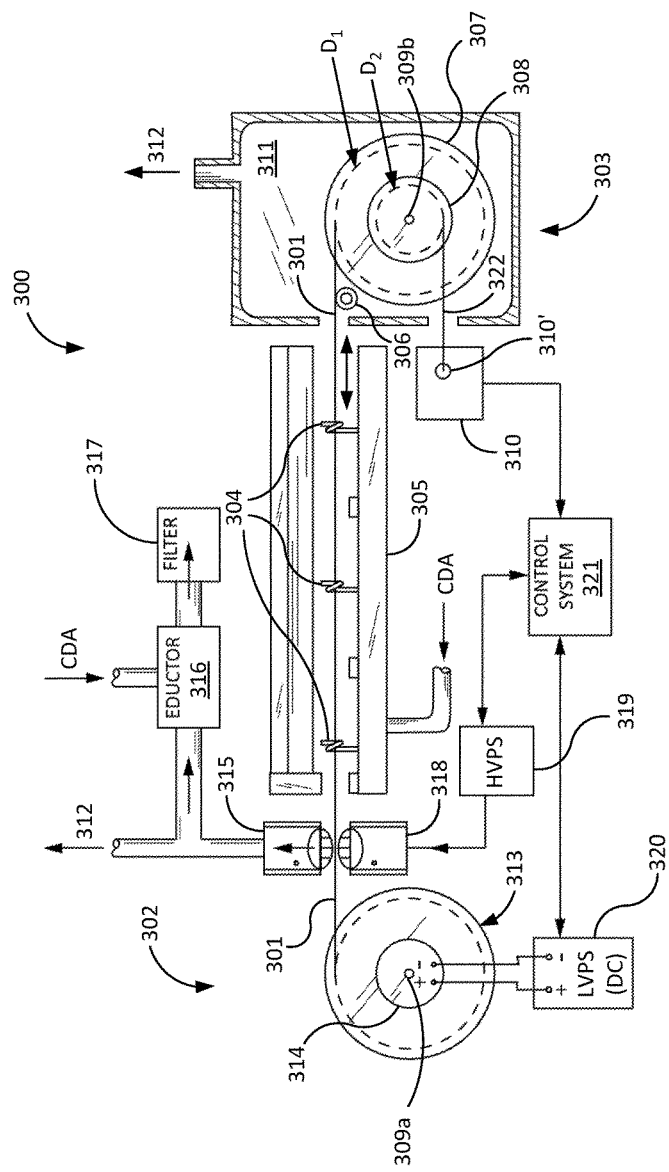
FIG. 3 schematically illustrates (in side-elevation view) a first preferred self-cleaning ionizing bar embodiment in accordance with the present invention.

With joint reference to FIGS. 3 through 5B, a first preferred self-cleaning linear ionizer 300 is first schematically represented in FIG. 3. As discussed herein, ionizer 300 of FIGS. 3-5B is physically and operationally the same as prior art ionizer 100 except as shown in the accompanying drawings and as discussed in this specification. According to this preferred embodiment of FIG. 3, the preferred invention may include:

1. An ionization cell 305 including at least one flexible wire electrode 301 and reference electrodes (items 104 and 105 in FIGS. 1 and 2 but hidden in FIG. 3);
2. An electrode-moving/driving spool assembly 302 with servo gear motor 314;
3. A constant-force ionizing electrode moving and tensioning system/assembly 303;
4. An electrode cleaning mechanism 315 which can be combined with an electrode contact arrangement 318 (means for applying) to improve the effectiveness of cleaning mechanism 315 and, optionally, to apply an ionizing signal a high voltage power supply 319 to wire electrode 301;
5. High and low voltage (either AC or DC, as selected based on design considerations and the exercise of ordinary skill in the art) power supplies 319 and 320, respectively, with an associated control system 321;

6. An optional debris collection and evacuation system 312, 316, and 317; and
7. An optional support element 304 for supporting the linear ion electrode 301.

In this embodiment, a single linear ion emitter 301 is preferably a flexible wire electrode that is resiliently biased between a wire-driving spool assembly 302 and a wire-tensioning and wire-movement spool assembly 303. Spool assembly 303 preferably includes a passive coiled power spring motor which is able to store and release rotational energy in a form of torque so that electrode 301 is stretched taut between spool assemblies 302 and 303 (Means for moving) with a tension Tw. Spool assembly 302 and spool assembly 303 are also referred to herein as the first and second spool assemblies and, inter alia, opposing ends of electrode 301 may be affixed thereto such that the working length of electrode 301 may be tautly disposed therebetween. The first spool assembly 302 may comprise a servo gear motor 314 and a first spool 313. The second spool assembly 303 may comprise a constant-force spring motor 310 and a second spool 307. In the embodiment of FIG. 3, the electrode 301 is coiled around the first electrode spool 313 as the drive motor 314 pulls the electrode 301 in a first axial direction along the working length thereof whereby at least some of the contaminant byproducts are abraded off of the surface of the wire electrode 301 by the electrode-cleaner 315. Also, the electrode 301 is coiled around the second spool 307 as the constant-force spring motor assembly pulls electrode 301 in the opposite axial direction along the working length thereof whereby at least some of the contaminant byproducts are abraded off of the surface of wire electrode 301 by the electrode-cleaner.

For long ionizers (about 1.0 meter or longer), wire electrode 301 may also be supported by plural intermediate support elements 304 such that rotation of the means for moving (first and second spool assemblies) causes axial movement of the wire electrode through the support elements 304. These supports 304 can be positioned on the air/gas supplying manifold 305 or on the bar enclosure (not shown in this Figure). More details of a physical implementation of this embodiment are presented with respect to FIG. 4 et seq.

The wire-tensioning and wire-movement spool assembly mechanism 303 preferably comprises a guide roll (or, alternatively, a pigtail guide) 306 and a spool/bobbin 307 resiliently biased by a spring motor 310 (means for tensioning). In use, flexible wire electrode 301 may be wound/coiled on spool 307 and the resulting wire electrode coil will have a diameter D1. As an option, spool 307 may hold a minimum of several wraps at all times and these end-wraps may be from the same or different material than emitter wire 301. Splicing a "tail" of different material onto an end of an expensive tungsten wire for such end wraps is an inexpensive way of secure the electrode to a spool rather than maintaining extra wraps of tungsten electrode that will never be deployed to produce charge carriers. The length of wire electrode 301 that can be coiled on spool 307 preferably should be greater than (at least equal to) the working length (the linear portion) of electrode 301 residing within ionization bar 300 (for example 1500 mm).

The spool 307 is preferably axially aligned with and fixedly attached to (or integrally formed with) a pulley/bobbin 308 with diameter D2. As shown, one end of a cord/cable 322 may be wound/coiled on pulley 308 and the other may be resiliently-biased with a constant tension force Fs to spring motor assembly 310. Spring motor assembly 310 may be a reel/retriever/spool/bobbin and is preferably rated for a retracting load/force of 100-300 grams. Those of ordinary skill in the art may calculate the resulting tension Tw on wire electrode 301 from the condition of equal torques for spools 307 and pulley 308 as follows:

$$Tw=Fs \times D2/D1$$

Wire electrode 301 is preferably a small diameter tungsten or titanium wire. However, electrode 301 may, alternatively, also be any other type of conventional (prior art) corona discharge wire. Control of the electrode-tension Tw is important during normal ionization mode (a static mode of operation) to reduce breakage as well as movement/vibration during ionization (since such movement/vibration may shorten the useful life of electrode 301). Similarly, control of the electrode-tension Tw is important during cleaning mode (a dynamic/moving mode of operation) to reduce breakage as well as to provide adequate contact between electrode 301 and cleaning mechanism 3151/(318). Therefore, it is important that the means for tensioning (spring-motor assembly 310) provide a substantially constant and stable electrode-tension during both static and dynamic modes of operation. As used herein, the tensional force is considered to be substantially constant if it is within 20 percent (plus or minus) of the predetermined desired tensional force. The spring motor/retriever assembly 310 may include a coil-spring rotation sensor 310' to monitor the number turns of pulley 308 (or spool 307 if 307 and 308 are stationary relative to one another) during the wire-cleaning mode for control of the wire-movement. The diameter D2 of pulley 308 is preferably less than that of spool 307 and, therefore, the tensional force on the cord is less than that on the wire electrode. Spool 307 and pulley 308 may be positioned inside a plastic (or other electrically isolative) enclosure 311 which may be in fluid communication with a pneumatic line and/or vacuum port 312 to support the high cleanliness of the wire moving and wire-tensioning assembly of ionizer 300.

Figure 5A:
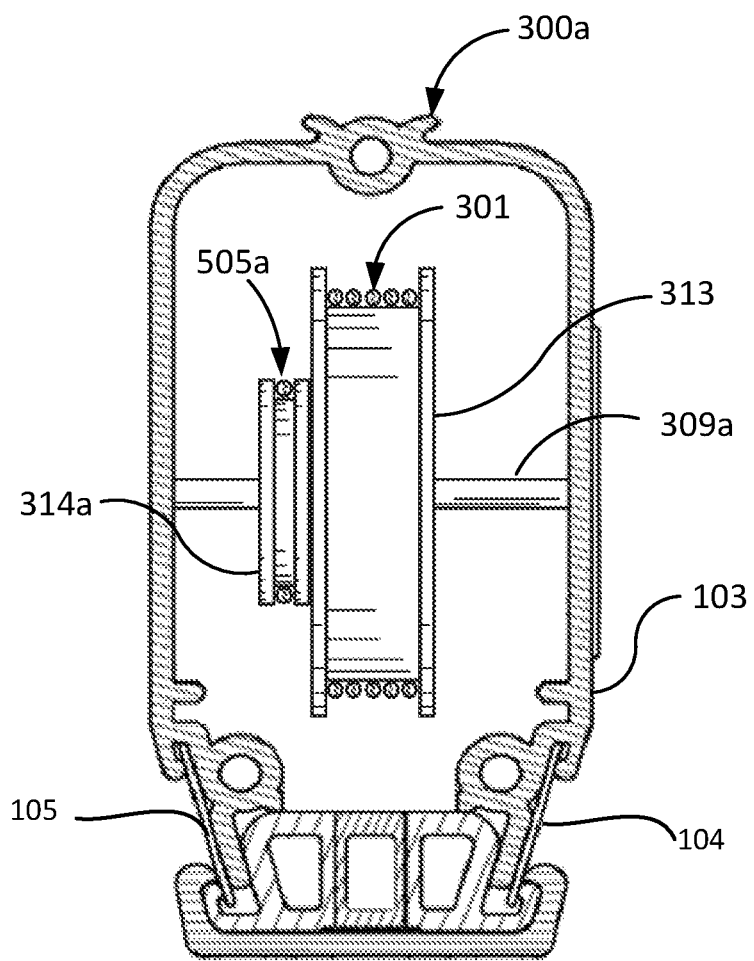
FIG. 5A is a cross-sectional elevation view of a physical implementation of the invention schematically presented in FIGS. 3 through 4D, this Figure showing a portion of a first spool assembly located within an inventive ionizer of the present invention.

Electrode-driving assembly 302 preferably comprises an electrically-isolating spool 313 (made of a conventional electrically isolative material such as common plastics) directly connected to a reversible servo gear motor 314. As an alternative to the arrangement shown in FIG. 3, spool 313 may instead be connected to a motor by a pulley/cord-based transmission (in other words, indirectly connected) for better electrical isolation of spool 313. A portion of this pulley/cord-based transmission arrangement preferably used in this alternative is shown in FIG. 5A below.

Wire-cleaning mechanism 315 may comprise one or more of the following abrading/cleaning elements: a brush, a wiper, a wire scraper, a closed or open cell foam block and/or other ablation means/electrode-cleaning means or other functional equivalent known in the art. Electrode-cleaner 315 may selectively engage electrode 301 and is preferably connected to a vacuum line 312 comprising an eductor 316 and an aerosol filter 317 for collecting contaminant byproducts/debris cleaned/abraded off of wire electrode 301. This means for evacuating enables the evacuation from the electrode-cleaner of at least some of the contaminant byproducts abraded off of the surface of the electrode.

Self-cleaning ionizing bar 300 may, optionally, include a wire-electrode-supporting/contacting device 318 to (1) selectively provide a consistent/reliable physical contact between cleaning mechanism 315 and electrode 301 (to urge them toward one another) during cleaning operation mode; and (2) apply a high voltage ionizing signal from HVPS 319 to electrode 301 during normal operation mode (means for applying). Supporting/contacting device 318 may comprise any one or more of the following: a simple metal spring contact, a spring-loaded brush or any other known equivalent to deliver ionizing electrical signals to electrode 301. Alternatively, spool 307 may be made from a conductive material such as metal and fixed on central conductive shaft 309*b* which is in electrical communication with high voltage power supply 319 through spring motor 310 (means for applying). In this way, ionizing signals may be applied to wire electrode 301 from HVPS 319 through the conductive shaft and spool to power wire emitter 301 in the normal ionization mode of operation. Regardless of how ionizing signals are applied to electrode 301, both of the low voltage 320 and high voltage 319 power supplies are preferably controlled by a microprocessor-based control system 321 to produce an ion cloud along electrode 301 in accordance with known techniques/methods/signals/operation.

FIG. 4A is a partial, perspective, and exploded view of a simplified assembly of an ionization cell 400. Those of ordinary skill will see the similarities between this embodiment of the invention and the prior art linear ionizers shown in FIGS. 1 and 2 (meaning bar 100 formed of ionization cells 101 and 102). Significantly, however, the embodiment of FIGS. 4A-4D simplifies construction, increases reliability, and lowers the cost of the inventive ionization bars by avoiding a number of spring assemblies and electrical contacts on each ionization cell.

The side grills/rails 405*a* and 405*b* are shown as exploded from base plate 203 for clarity. Electrode support elements 406*a* and 406*b* can be mounted on opposite ends of base plates 203 and 204 (only partially shown) to support ionizing wire 301. Those of skill in the art will appreciate that wire electrode 301 defines an axis along the length thereof and support elements 406*a* and 406*b* restrain movement of electrode 301 in all directions except along the axis defined by electrode 301.

With joint reference now to FIGS. 4B, 4C, and 4D, a preferred pigtail support/guide element 406*a*/406*b* is shown in a top view in FIG. 4B. The same pigtail support is shown in orthogonal side elevation views in FIGS. 4C and 4D. Naturally, the threaded end of the pigtail support is intended to affix the support to the ionization cell 400 through base plates 203, 204. The opposing free end preferably takes the form of a helical pigtail guide 407 which permits axial movement of electrode 301 therethrough. Further, electrode 301 may be inserted into helical guide/support 301 in a direction other than in the direction of the electrode axis during assembly of the inventive ionizer or during replacement of an old/spent/used electrode. While elements 406*a*/406*b* are preferably fabricated from conductive (or semi conductive materials) such as thick stainless steel wire that are bent into shape and threaded, they must be electrically isolated from each other as well as from ground. One simple way to ensure this is to ensure that base plates 203 and 204 are formed of electrically insulating material. In this preferred embodiment, pigtail supports can be mounted, for example, on each ionization cell 400 (instead of using the springs employed by prior art devices) in spaced relation to prevent wire 301 from sagging and/or vibrating between the support elements.

It will be appreciated that, in FIG. 4A, ion emitter 301 is positioned in spaced relation to cell base plates 203, 204 (over a manifold having air jet nozzles). Further, emitter 301 is at least generally centrally located as in the known linear bars. In this preferred embodiment, emitter 301 is also preferably supported by group of pigtail guides (406*a*, 406*b* and so on).

Figure 5B:
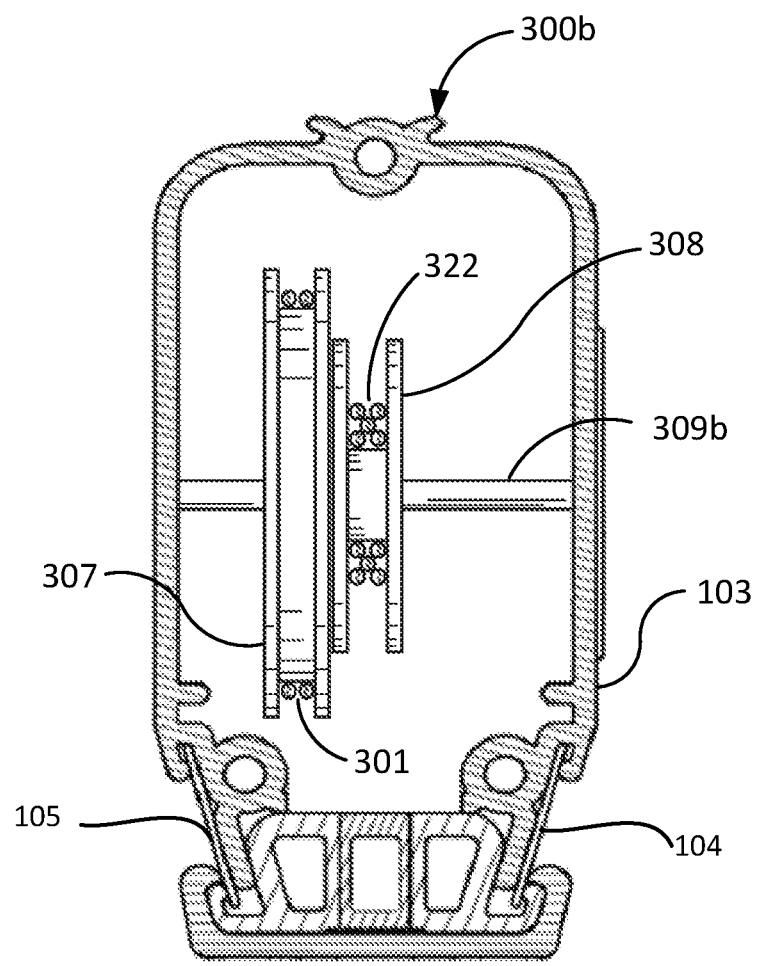
FIG. 5B is a cross-sectional elevation view of a physical implementation of the invention schematically presented in FIG. 3 through 5A, this Figure showing an opposing spool assembly located within an inventive ionizer of the present invention.

Simplified side cutaway views of an inventive self-cleaning ionizing bar are shown in FIGS. 5A and 5B. They show a first spool assembly cross-section 300*a* and a second spool assembly cross-section 300*b* of an ionizer 300, respectively, both positioned within a linear ionization bar housing. This housing is the same in all important respects to conventional housing 103. In the embodiment of FIG. 5A, a spool 313 carries coiled emitter wire 301 and a pulley 314*a* is connected to servo motor (not shown) by a belt 505*a*. Both pulley 314*a* and belt 505*a* may be made of an electrically isolative material such as conventional polymers or plastics or equivalents known in the art. Further, spool 313 and pulley 314*a* are shown as being fixedly attached to (or integrally formed with) one another and are disposed on and for rotation about axle 309*a*. Those of skill in the art will appreciate that the pulley/belt arrangement discussed with respect to FIG. 5A represents an alternative to the servo gear motor arrangement shown in FIG. 3. One benefit of the arrangement of FIG. 5A compared to that of FIG. 3 is a decrease in any possible leakage current from the high voltage applied to wire 301 and to low voltage servo motor.

As shown in FIG. 5B, spool 307 carries emitter wire 301 coiled thereon and pulley 308 carries a cord 322 coiled thereon. Cord 322 connects pulley 308 with spring-motor or retriever assembly (not shown here but see sensor 310' and motor 310 of FIG. 3). As shown in FIG. 5B, a cross-section 300*b* of ionizer 300 reveals that the second spool assembly is preferably positioned inside of an elongated bar enclosure of the same general type as enclosure 103 of prior art ionizer 100. In particular, spool 307 and pulley 308 are shown as being fixedly attached to (or integrally formed with) one another and are disposed on and for rotation about axle 309*b*. Axle 309*b* and cord 322 may, optionally, be made of a conventional electrically isolative material such as various plastics known in the art. Alternatively, spool 307 and axle 309*b* may be made of a conventional conductive material (such as various metals known in the art) and in electrical communication with HVPS 319 (although not shown in FIG. 3, such electrical communication could be provided through spring motor 310 or other arrangement as a mere matter of design choice). Further, in accordance with various preferred embodiments of the invention shown herein, the wire emitter, the gas-supplying manifold, and emitter-support elements can all be positioned between the two opposing spool assemblies.

Returning to FIG. 3, preferred methods of using inventive linear ionizer in accordance with the invention will now be discussed with particular emphasis on methods of self-cleaning (the cleaning mode of operation) a flexible wire electrode used in the invention. The self-cleaning mode is preferably initiated with microprocessor-based control system 321.

Control system 321 may monitor the ion current of the ionization cell (using a conventional HVPS current sensor, not shown), the ion balance of the ionized gas flow delivered to the target workpiece (using a conventional ion balance sensor, not shown) or both. If the ion current and/or the ion balance is/are determined to be outside of predetermined limits, control system 321 may either (1) inform relevant personal that electrode cleaning is warranted, and/or (2) initiate automatic electrode cleaning by initiating a cleaning mode of operation. In either case, ionizer 300 will enter an electrode cleaning mode of operation to restore ionizing performance within the predetermined current and/or balance limits.

The cleaning mode begins with the step of checking the status of high voltage power supply (HVPS) 319 and (if not already in a "Standby" mode) switching it to a "Standby" mode. Control system 321 will also stop the flow of CDA/ gas to the manifold and restore the CDA pressure to eductor 316 at the connection to fab/tool vacuum line 312. Then, control system 321 turns-on the low voltage DC power supply 320 (LVPS) that is connected to servo motor 314. Since servo motor 314 has a large big reduction gear (not shown) it starts slow rotation of spool 313. This begins to wind/coil corona wire 301 from spool 307, and axially pull it through support elements 304 and cleaner 315, and onto spool 313. Since spool/bobbin 313 is preferably connected to a servo motor 314 made from a conventional highly electrically isolative material (such as an ABS plastic or other equivalents known in the art) the possibility of current leakage from emitter wire 301 to motor 314 is reduced/ eliminated when ionizer 300 operates in the normal/ionization mode (when ionizing signals are applied to electrode 301). Electrical isolation can be further enhanced if both spool 313 and pulley 314a are also made from a conventional highly electrically isolative material (such as an ABS plastic or other equivalents known in the art).

In this cleaning mode of operation the amount of current applied from LVPS 320 to servo motor 314 depends on the tension Tw of wire electrode 301. Information about this current can be used by control system 321 to monitor wire electrode tension and/or the status of other wire parameters (such as the degree of wire contamination or wire breakage). For this reason, motor current signals provided by LVPS 320 are preferably monitored by control system 321 during the wire cleaning mode of operation.

Further in this embodiment, one end of corona wire electrode 301 is affixed to spool 313 and the opposite end is affixed to spool 307. Wire tension Tw is substantially constant and balanced by a conventional constant-force spring-motor assembly such as a coiled spring, a retriever, a reel, and/or any other equivalent constant-force spring known in the art. Examples of constant-force spring motor assemblies of the type preferably used in the present invention include those made and offered by Spring John Evans' Sons, Inc. of 1 Spring Ave., Lonsdale, Pa. 19446 with the following product names/descriptions: Enclosed Reels ER04, ER06, ER08; Retreiver 3827-B; and/or Miniature enclosed reel MER-04-SP. Examples of other equivalent spring motor assemblies will readily occur to those of ordinary skill in the art.

The tension force experienced by wire electrode 301 during cleaning may be equal to or greater than that typically experienced by wire electrode 301 during the normal ionization mode. During this period, spring motor 310 will store/accumulate rotational energy. In the cleaning mode, wire 301 is drawn or pulled onto/wound around spool 313 and also passes through upstream cleaning mechanism 315. When this occurs, cleaning mechanism 315 preferably abrades off and also traps contaminant particles/debris abraded from the surface of the electrode. Restated, rotational movement of the first and second spool assemblies causes axial movement of the wire electrode along the working length thereof whereby at least some of the contaminant byproducts are abraded off of the surface of the wire electrode by the electrode-cleaner. Particularly desirable cleaning mechanisms for use in the invention include brushes, springs, closed or open cell foam blocks, felt pads, and/or other wire cleaning/polishing means known in the art.

As a first stage of cleaning, cleaning mechanism 315 (and servo motor 314, if desired) may be continuously evacuated by a vacuum (or low pressure) air stream created by eductor 316 so that contaminant byproducts/debris/particles (removed from the surface of wire 301) will also be removed from cleaner 315. In particular, the inlet of eductor 316 may be connected to a clean dry air (CDA) line and the outlet of the eductor 316 can be connected to a filter 317 to thereby draw the degradation products away from cleaner 315 and remain trapped in filter 317.

After the full working length (for example 1,500 mm) of emitter wire 301 is wound around spool 313, the wire movement preferably stops. For control system purposes, a stop-signal may be generated by sensor 310' or, alternatively, by counting the number of rotations of spool 313 or of spool 307. In response thereto, control system 321 will turn off servo motor 314 and reverse the polarity of the voltage applied to motor 314 by LVPS 320 so that motor 314 reverses direction and spool 313 starts unwinding corona wire 301. Since the tension on emitter 301 is counterbalanced by spring-motor/retriever assembly 310, the opposite end of wire 301 will start to wind back onto spool 307 as spring motor assembly 310 releases the previously stored rotational energy. As this happens, cleaning mechanism 315 begins a second stage of cleaning/polishing/abrading that enhances wire clearness before ionization cell 300 enters into the ionization mode of operation again. If desired, multiple cleaning/polishing cycles/rounds may occur before cell 300 enters into the ionization mode of operation again. At the end of the cleaning mode spring motor 310 again keeps wire tension on constant preselected level Tw during normal operating mode of the linear bar.

Those of ordinary skill in the art will appreciate that spools 313 and 307 may be sized and shaped to accommodate lengths of corona wire 301 far longer than that of bar 300. If so, multiple ionization operations can occur before even one cleaning operation (with two phases) is completed since electrode 301 may be advanced as appropriate to present new/fresh sections for each ionization operation. In this case, the initial phase of cleaning will occur as the wire is advanced past cleaner 315, but the second cleaning phase (reversal of wire direction and rewinding of the entire length of wire 301) will not begin until the desired number of ionization operations occurs. Thus, a variety of operational mode combinations may be executed as desired if spools 313 and 307 are sized and shaped to accommodate lengths of corona wire 301 longer than that of bar 300.

In sum, according to the embodiment of FIGS. 3 through 5B, the emitter wire tensioning system preferably includes a combination of active and passive motors with plastic/ isolative spools. Further, spools 307 and 313 (as well as the spring-motor 310) can (optionally) be placed in highly electrically isolative enclosures such as enclosure 311 (in the case of spool 307). Moreover, the wire cleaning/tensioning system may also provide an efficient and effective means to power ionizing emitter 301 and it may do so in a way that prevents leakage current from the emitter wire 301 during normal ionization operations.

Figure 6:
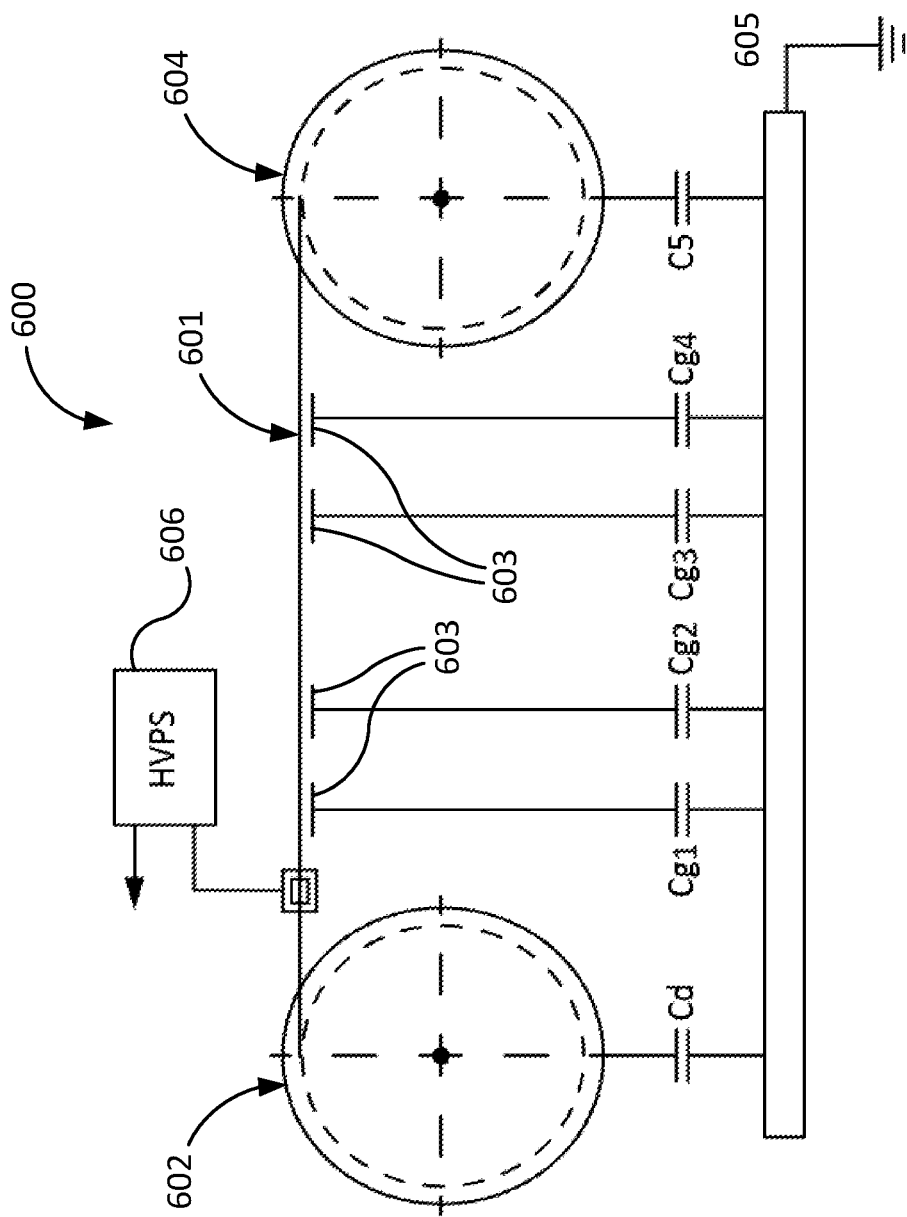
FIG. 6 is a simplified electrical circuit model showing the parasitic/stray capacitances inherently embodied in the inventive self-cleaning linear ionizer of FIGS. 3 through 5B.

Turning now to FIG. 6, there is shown a simplified electrical circuit model 600 showing the parasitic/stray capacitances inherently embodied in the inventive self-cleaning linear ionization bar of FIGS. 3 through 5B. As shown, the spool with coiled emitter wire 601 on the schematically-represented driving-end-section 602 presents a stray capacitance Cd, a group conductive wire guides 603 present stray capacitance $Cg_1$-$Cg_4$ and the schematically represented spool and spring-motor-assembly 604 present a stray capacitance C5. All capacitors representing the various stray capacitances terminate on a grounded reference electrode 605. The model 600 of FIG. 6 shows that high voltage power supply 606 primarily sources currents into parasitic capacitance and corona ionization. Naturally, operational efficiency can be improved through the minimization of parasitic/leakage current conditions and this may be achieved in the following ways:

affixation of wire guides into dielectric materials of ionization cells, manifolds and/or enclosures;

the use of plastic/electrically-isolative spools, plastic pulleys, and rubber belts in drive units; and/or the use of passive mechanical (spring motor) parts, non-conductive spools, cording, and/or enclosures in the electrode tensioning system(s).

Figure 1:
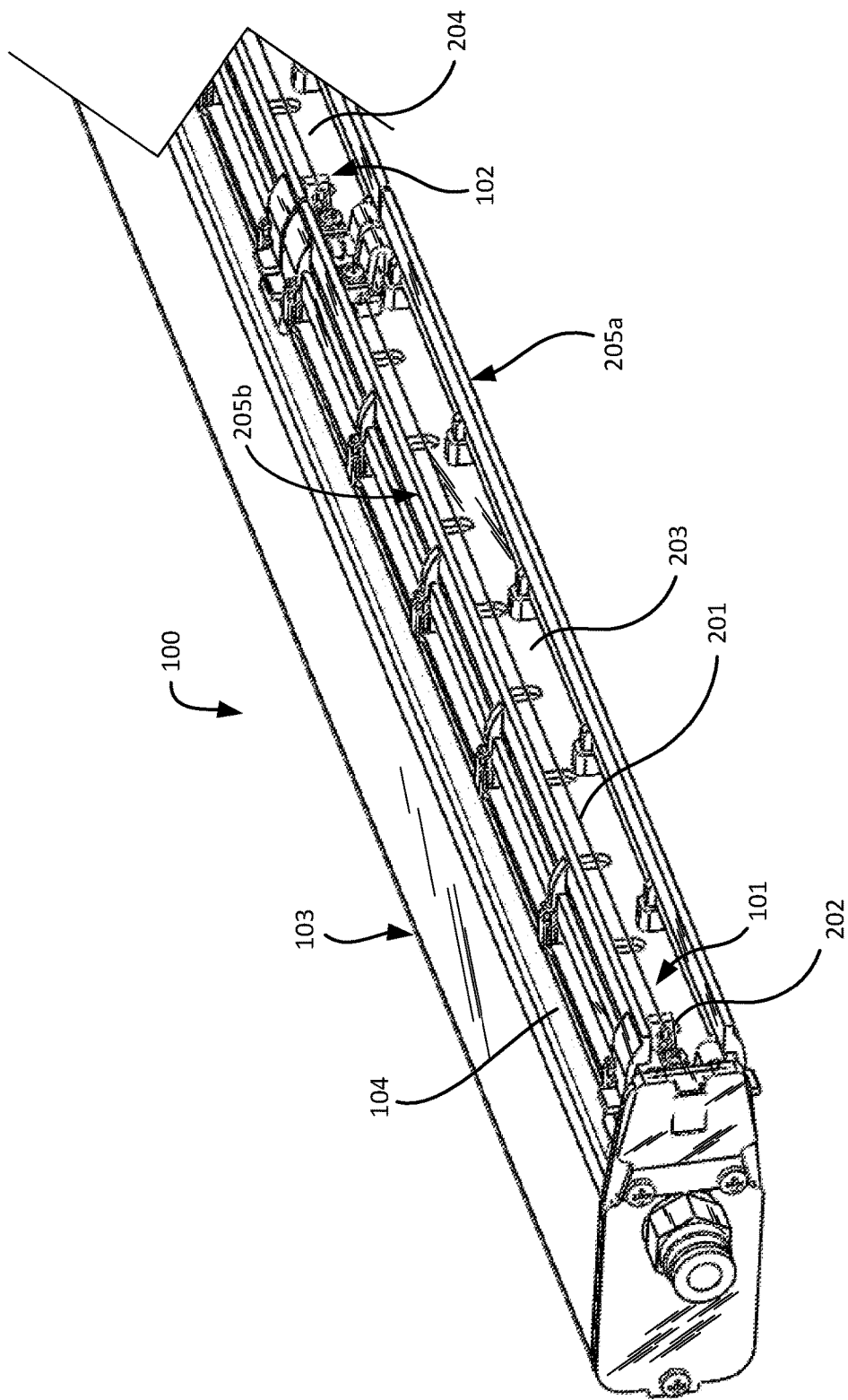
FIGS. 1 and 2 are perspective and bottom views, respectively, of one conventional linear ionizing bar of incorporated prior art reference U.S. Pat. No. 8,492,733.
Figure 2:
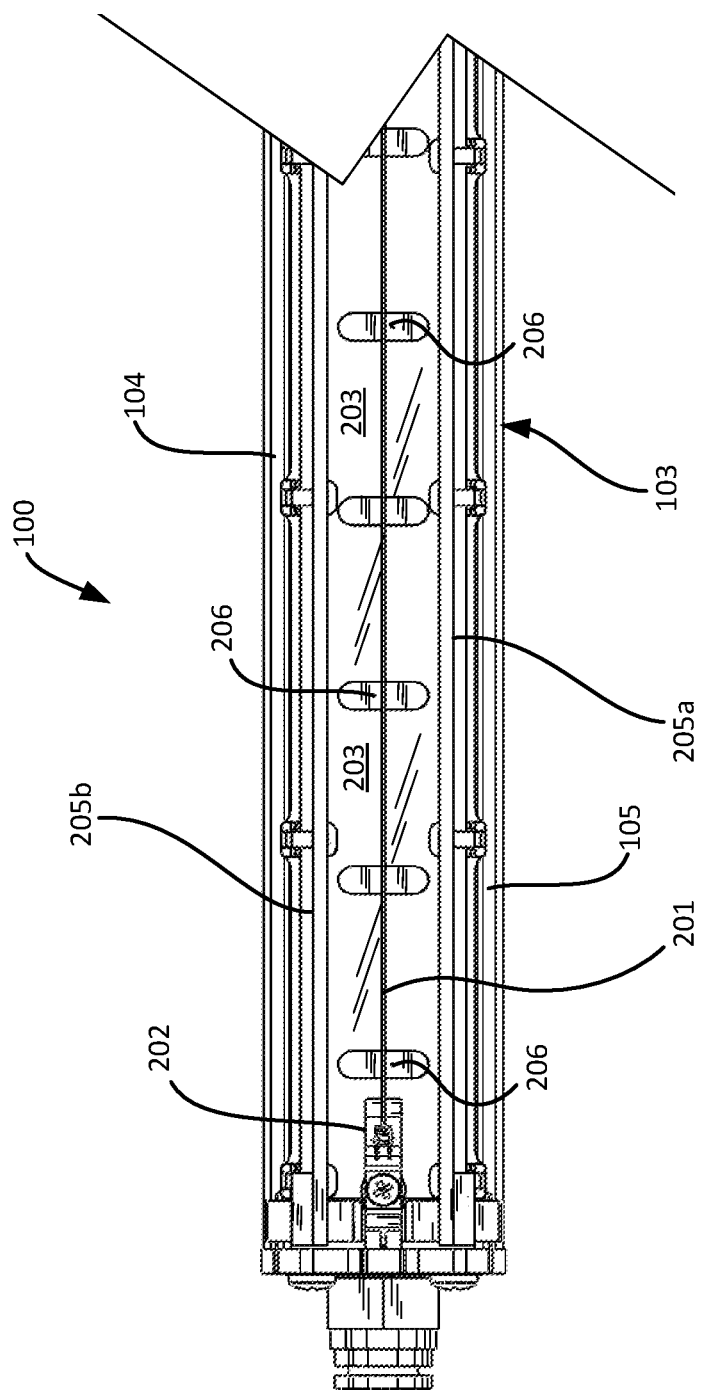

In some cases its preferable to have a linear bar comprising a system of easily exchangeable linear ionization cells (such as those previously discussed with respect to FIGS. 1, and 2). The constant force spring mechanisms and/or spring retrievers taught herein with respect to the embodiment of FIGS. 3-5B can also be used in other embodiments of the inventive ionization bars.

FIG. 7A illustrates an another preferred embodiment of an inventive linear ionizing bar 700. This embodiment is preferably equipped with an alternative electrode-cleaning mechanism/means that may include one or more electrically isolative filaments positioned in proximity with and parallel to the ionizing electrode 701 axis wire and an electrode-cleaning shuttle 705 that may move with the filament (along axis parallel to the electrode axis) and slide along the length of the electrode from one end of the ionizer to another. The filaments may be made of one of the many conventional electrically isolative materials such as polymers or plastics. The shuttle 705 may be additionally supported and guided by both rails 706a and 706b. In this way the shuttle may selectively abrade at least some of the contaminant byproducts off of the surface of the ionizing electrode. The filament(s) is/are preferably in tensioned and stretched between opposing and counter-balanced spool assemblies (of the type discussed above with respect to FIGS. 3-5B) of the cleaning system to permit the shuttle to ride thereon.

In this embodiment the cleaning mechanism most preferably comprises, for example, two filaments 702a and 702b in which one end of each filament is connected to a driving section 703 that may include a spool connected to small servo gear motor (not shown). Driving section 703 is functionally similar to that previously discussed with respect to FIGS. 3 and 5a in all important respects. Further, the opposite end of each of filaments 702a and 703b is connected to spring/retriever section 704 which includes a spool linked to constant-force spring mechanism or spring retriever (not shown). Sections 703 and 704 may comprise the means for moving the cleaning mechanism discussed herein with respect to this embodiment. Section 704 is functionally similar to that previously discussed with respect to FIGS. 3 and 5b in all important respects. Finally, filaments 702a and 702b are preferably fixedly attached to and therefore carry cleaning "platform" or "shuttle" 705.

According to the embodiment of FIGS. 7A and 7B each filament may be made from plastic polymers such as nylon, polyethylene, polyamide, Teflon and/or other highly flexible and electrically isolative materials. Preferred filaments are round in cross-section with a diameter in the range of about 0.05 mm to about 2 mm (functional, but not preferred, filaments may have a larger diameter), have a smooth surface, and have low adhesion/highly hydrophobic properties. Preferred filament diameters are about equal to that of the ion emitter but may be up to about 2-3 times larger than that of the ion emitter. As a result, filament tension can be significantly higher than wire electrode tension. It should be noted that for installations with a downward facing ionizer, filament tension should be increased sufficiently to oppose the force of gravity to thereby ensure that the filament does not sag downwardly. This increased filament tension might require the selection of a larger filament diameter.

Filaments 702a and 702b may perform several different functions simultaneously. One of these functions is to carry (support) cleaning platform 705. Another is to serve as a mechanical protection grid for ion emitting wire 701. Moreover, the high electrical resistivity of the filaments means that they also serve as a grid that enhances ion balance of the air/gas stream produced by linear ionizing bars in accordance with this invention.

According to a related embodiment, the cleaning mechanism may comprise plural filaments in which at least one filament 702a can be made from a flexible conductive material (such as stainless steel) and in which other filaments 702b can be made from electrically isolative materials. In this embodiment, the conductive filament 702a can be grounded (or electrically biased) and, therefore, inherently serve as a non-ionizing reference electrode. Further, the electrode cleaner may comprise at least one guide that engages at least one ionizer rail, and the electrode cleaner may be connected to at least one filament that is a non-ionizing reference electrode.

Turning now to FIG. 7B now, this Figure illustrates a simplified cleaning platform or cleaning shuttle 705 of the type shown in FIG. 7A. As shown, shuttle 705b is preferably fixedly attached to filaments 702a and 702b and may include one or more of a variety of different wire cleaners 708. These may include a simple brush cleaner, a wiper, a wire scraper, a closed or open cell foam block, and/or any other equivalent means for cleaning, material or arrangement known in the art. Although primarily intended to clean a wire electrode 701, shuttle 705 may also carry side cleaners/brushes (not shown) to clean rails 706a and 706b. The shuttle 705 also may have additional support from the top side of rails 706. If so, shuttle guides 709 may slide on or in rails 706a, 706b. Preferably, shuttle 705 will be "parked" inside driving section 703 when not in use, for example, after a cleaning operation.

A wire cleaning operation in accordance with the embodiment of FIGS. 7A and 7B is initiated by the microprocessor of a control system 707. The system 707 will check the status of the high voltage power supply (see FIG. 3) and, if is on, switch it to "Standby" mode for the duration of the corona wire cleaning operation. At the start, cleaning shuttle 705 will be in its parking place and the filament(s) will be coiled on the spool in the same driving section 703. Then, the control system 707 turns "ON" low voltage DC power supply (LVPS) and a servo motor (see FIG. 3). The motor starts to rotate the spool and to unwind filament(s) 702a and 702b.

Filament(s) 702a and 702b move (are pulled) under tension created/defined by the spring motor or retainer 704 during unwinding. As the result, cleaning shuttle 705 moves along the bar and cleans emitter wire 701 (and, optionally, the springs and grills of the ionization cell if the shuttle is equipped with the optional side cleaners/brushes). As soon as shuttle 705 reaches the spring section 704, control system 707 stops it and reverses the rotational direction of the driving motor in section 703 and the shuttle is pulled in the opposite direction. The cleaning mode finally terminates when the shuttle 705 reaches its original parking place in section 703 once again.

In some cases, it may be possible to have number of wire cleaning/polishing cycles/runs. The spring motor 704 keeps the tension of all of the filament(s) at a constant/preselected level during ionization and cleaning operating modes of the linear ionizer.

The time table for corona wire cleaning can be daily, weekly, or monthly or any other schedule depending on environmental conditions in the field. Relatively long self cleaning linear bars can be the most economical solution (long bars take more time to clean and ratio of the cost of the auto-cleaner function to the cost of the bar itself is smaller).

While the present invention has been described in connection with what is presently considered to be the most practical and preferred embodiments, it is to be understood that the invention is not limited to the disclosed embodiments, but is intended to encompass the various modifications and equivalent arrangements included within the spirit and scope of the appended claims. With respect to the above description, for example, it is to be realized that the optimum dimensional relationships for the parts of the invention, including variations in size, materials, shape, form, function and manner of operation, assembly and use, are deemed readily apparent to one skilled in the art, and all equivalent relationships to those illustrated in the drawings and described in the specification are intended to be encompassed by the appended claims. Therefore, the foregoing is considered to be an illustrative, not exhaustive, description of the principles of the present invention.

Other than in the operating examples or where otherwise indicated, all numbers or expressions referring to quantities of ingredients, reaction conditions, etc. used in the specification and claims are to be understood as modified in all instances by the term "about." Accordingly, unless indicated to the contrary, the numerical parameters set forth in the following specification and attached claims are approximations that can vary depending upon the desired properties, which the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

For purposes of the description hereinafter, the terms "upper", "lower", "right", "left", "vertical", "horizontal", "top", "bottom", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

What is claimed is:

1. A self-cleaning linear ionizer comprising:
   at least one flexible and movable ionizing electrode that defines an axis along a stationary linear working length of the electrode, the electrode establishing a linear ion cloud along the working length of the electrode in response to the application of an ionizing signal to the electrode;
   at least one stationary electrode-cleaner that may selectively engage the movable electrode along the linear working length of the electrode;
   means for applying an ionizing signal to the electrode to establish the linear ion cloud, wherein the working length of the electrode has a surface that develops degradation products in response to the application of the ionizing signal;
   means for moving the electrode along the linear working length of the electrode such that the electrode-cleaner removes at least some of the surface degradation products from the electrode during movement; and
   means for tensioning the electrode on the means for moving such that a substantially constant tensional force is maintained on the electrode.

2. The self-cleaning linear ionizer of claim 1 further comprising plural guide elements for supporting the electrode such that the electrode is axially movable along the linear working length of the electrode and urged into contact with the electrode-cleaner.

3. The self-cleaning linear ionizer of claim 1 wherein the means for moving the electrode comprises first and second spool assemblies disposed on opposite sides of the linear working length, and wherein first and second ends of the electrode are respectively affixed to the first and second spool assemblies such that the working length of the flexible wire electrode is disposed therebetween, and wherein the means for tensioning comprises a constant-force spring motor assembly operatively associated with at least one of the first and second spool assemblies.

4. The self-cleaning linear ionizer of claim 3 wherein the means for applying comprises the second spool assembly and the spring motor assembly.

5. The self-cleaning linear ionizer of claim 1 further comprising plural pigtail guides wherein each guide has a helical end that permits axial movement of the ionizing electrode therein and wherein the means for applying is in electrical communication with a high voltage power supply and comprises an electrically conductive spool onto which the electrode is coiled.

6. The self-cleaning linear ionizer of claim 1 wherein the flexible electrode is a wire that has first and second opposing ends and is longer than the working length of the electrode, wherein the means for moving the electrode comprises first and second spool assemblies disposed on opposite sides of the linear working length, and wherein the first and second ends of the electrode are respectively affixed to the first and second spool assemblies such that the working length of the flexible wire electrode is disposed therebetween.

7. The self-cleaning linear ionizer of claim 6 wherein the surface degradation products comprise contaminant byproducts, and wherein rotation of the first and second spool assemblies causes axial movement of the wire electrode along the working length of the electrode whereby at least some of the contaminant byproducts are abraded off of the surface of the electrode by the electrode-cleaner.

8. The self-cleaning linear ionizer of claim 7 wherein
the first spool assembly comprises a servo gear motor and a first electrode spool;
the second spool assembly comprises a second electrode spool;
the electrode is coiled around the first electrode spool as the servo gear motor pulls the electrode in a first axial direction along the working length of the electrode whereby at least some of the contaminant byproducts are abraded off of the surface of the wire electrode by the electrode-cleaner; and
the means for tensioning the electrode comprises a constant-force spring motor assembly operatively associated with the second spool assembly to thereby counterbalance the tensional force applied to the electrode by the servo gear motor.

9. The self-cleaning linear ionizer of claim 8 wherein the electrode is coiled around the second spool as the constant-force spring motor assembly pulls the electrode in the opposite axial direction along the working length of the electrode whereby at least some of the contaminant byproducts are abraded off of the surface of the wire electrode by the electrode-cleaner.

10. The self-cleaning linear ionizer of claim 7 further comprising means for evacuating the contaminant byproducts from the electrode-cleaner as they are abraded off of the surface of the electrode.

11. The self-cleaning linear ionizer of claim 1 wherein
the ionizer further comprises plural support elements for supporting the electrode;
the means for moving the electrode comprises first and second spool assemblies disposed on opposite sides of the linear working length of the electrode;
the electrode is longer than the working length of the electrode and has first and second opposing ends affixed to the first and second spool assemblies that the working length of the electrode is tautly disposed therebetween; and
rotation of the first and second spool assemblies causes axial movement of the wire electrode through the support elements.

12. The self-cleaning linear ionizer of claim 1 wherein the means for applying comprises the at least one stationary electrode-cleaner.

13. A method of using a linear ionizer of the type having a movable ionizing electrode with opposing ends and a linear and axis-defining working length that is less than the length of the electrode, a stationary electrode-cleaner that may engage the electrode along the linear working length of the electrode, opposing spool assemblies to which the electrode ends are affixed such that the working length of electrode is disposed between the opposing spool assemblies, and a constant force spring assembly tensioning the electrode between the opposing spool assemblies such that a substantially constant tensional force is maintained on the electrode, the method comprising:
during an ionization mode of operation, applying an ionizing signal to the ionizing electrode to thereby establish a linear ion cloud along the linear working length of the electrode whereby the electrode surface develops degradation products, and
during a cleaning mode of operation, rotating the spool assemblies to thereby move the ionizing electrode in a first axial direction such that the electrode-cleaner removes the surface degradation products from the electrode along the working length of the electrode.

14. The method of using a linear ionizer of claim 13 wherein the ionization and cleaning modes of operation occur simultaneously.

15. The method of using a linear ionizer of claim 13 wherein the ionization and cleaning modes of operation do not occur simultaneously.

16. The method of using a linear ionizer of claim 13 wherein the degradation products are contaminant byproducts.

17. The method of using a linear ionizer of claim 16 wherein the cleaning mode of operation comprises first and second phases, wherein the first cleaning phase comprises rotating the spool assemblies to thereby move the ionizing electrode in a first axial direction such that the electrode-cleaner abrades contaminant byproducts off of the surface of the electrode along the working length of the electrode, and wherein the second cleaning phase comprises rotating the spool assemblies in a direction opposite to that of the first cleaning phase to thereby move the ionizing electrode in an axial direction opposite to that of the first cleaning phase such that the electrode-cleaner abrades contaminant byproducts off of the surface of the electrode along the working length of the electrode.

18. The method of using a linear ionizer of claim 16 cleaning mode of operation further comprises the step of evacuating the contaminant byproducts abraded off of the surface of the electrode from the electrode-cleaner.

19. The method of using a linear ionizer of claim 13 wherein the ionization and cleaning modes of operation are alternately repeated.

20. The method of using a linear ionizer of claim 13 wherein the cleaning mode of operation is repeated at least twice in a row before each time the ionization mode of operation is repeated.

21. A self-cleaning linear ionizer comprising:
at least one flexible ionizing electrode that defines a linear working length of the electrode, the electrode having opposing ends and a surface, and the electrode establishing a linear ion cloud along the working length of the electrode in response to the receipt of an ionizing signal, wherein the working length of the electrode is stationary relative to the ionizer but the electrode is movable;
at least one stationary electrode-cleaner that is in physical contact with the surface of the electrode along the linear working length of the electrode; and
opposing spool assemblies to which the opposing ends of the electrode are affixed, the assemblies axially moving the ionizing electrode such that the electrode-cleaner cleans the surface of the electrode during movement; and
a constant force spring assembly tensioning the electrode between the opposing spool assemblies such that a substantially constant tensional force is maintained on the electrode.

22. A self-cleaning linear ionizer comprising:
at least one linear ionizing electrode that defines an axis, the electrode establishing a linear ion cloud along the length of the electrode in response to the application of an ionizing voltage thereto, wherein the electrode is stationary relative to the ionizer;

at least one electrode-cleaner that is movable parallel to the electrode axis and that may selectively engage the electrode;

means for applying an ionizing signal to the ionizing electrode to thereby establish the linear ion cloud, wherein the electrode has a surface that develops contaminant byproducts in response to the application of the ionizing signal to the electrode; and means for moving the electrode-cleaner along the electrode such that the electrode-cleaner abrades at least some of the contaminant byproducts off of the surface of the electrode during movement of the electrode-cleaner.

23. The self-cleaning linear ionizer of claim 22 wherein the electrode-cleaner comprises a pair of filaments disposed on opposite sides of the electrode and a shuttle fixedly attached to the filaments, and wherein the means for moving the electrode-cleaner moves the filaments in directions that are parallel to the electrode axis whereby the shuttle abrades at least some of the contaminant byproducts off of the surface of the electrode.

24. The self-cleaning linear ionizer of claim 23 wherein the electrode cleaner comprises at least one guide that engages at least one ionizer rail, and wherein the electrode cleaner is connected to at least one filament that is a non-ionizing reference electrode.

* * * * *